Dec. 27, 1966 A. SCHMITZ 3,295,031

SOLID SEMICONDUCTOR CIRCUIT WITH CROSSING CONDUCTORS

Filed June 10, 1964 3 Sheets-Sheet 1

INVENTOR.
ALBERT SCHMITZ
BY
[signature]
AGENT

Dec. 27, 1966 A. SCHMITZ 3,295,031

SOLID SEMICONDUCTOR CIRCUIT WITH CROSSING CONDUCTORS

Filed June 10, 1964 3 Sheets-Sheet 2

INVENTOR.

ALBERT SCHMITZ

BY

AGENT

INVENTOR.
ALBERT SCHMITZ
BY
Frank R. Trifari
AGENT

United States Patent Office 3,295,031

Patented Dec. 27, 1966

3,295,031
SOLID SEMICONDUCTOR CIRCUIT WITH CROSSING CONDUCTORS

Albert Schmitz, Emmasingel, Eindhoven, Netherlands, assignor to North American Philips Company, Inc., New York, N.Y., a corporation of Delaware Filed June 10, 1964, Ser. No. 373,953
Claims priority, application Netherlands, June 17, 1963, 294,168
3 Claims. (Cl. 317—235)

This invention relates to composite semiconductor devices (sometimes referred to as "solid circuits") comprising a semiconductor carrier body covered, at least on one side, with insulating layer such as, for example, a silicon-oxide layer at which side the body is also provided with a plurality of circuit elements such as transistors, diodes, resistors and the like, while conductors are provided on the insulating layer for forming conductive connections. The term "conductive" is to be understood herein to mean conductive for electric current.

Complex semiconductor devices of the above-mentioned kind are now generally known in the semiconductor technique and constitute circuits such as, for example, flip-flop circuits, amplifying circuits or filter circuits, or parts thereof.

In many cases the carrier body itself forms part of one or more of the circuit elements provided on one side of the carrier body. Thus, a circuit element may comprise, for example, a transistor having a diffused base zone which is obtained by local diffusion of an impurity into the surface of the carrier body, while the emitter zone of the transistor is formed on or in the base zone and the carrier body itself constitutes the collector zone of the transistor.

The carrier body may also be high-ohmic or intrinsic and may serve only as a substantially insulating carrier plate for the circuit elements.

The insulating layer serves inter alia to shield at least part of the available p-n junctions from the ambient at the areas where they appear at the surface of the carrier body, in order thus to improve the electrical properties of these junctions.

The conductive connections required between the circuit elements in the said devices are formed at least in part by conductors present on the insulating layer. Such conductors are, for example, conductive strips obtained by evaporation-deposition of aluminum or silver on the insulating layer.

In composite semiconductor devices of the kind described, intersecting conductive connections are in many cases desirable for a favorable or necessary arrangement of the circuit elements. For certain circuit crossings of conductive connections may in practice be necessary, in other cases a crossing of conductive connections may be desirable for an arrangement of the circuit elements which is favorable for technical reasons of manufacture, while in many cases where a crossing of conductive connections is not required, considerable simplification in the pattern of the conductors formed on the insulating layer may be obtained by the use of one or more crossings.

A crossing of conductive connections could be obtained, for example, in that a conductor already available on the insulating layer is locally covered with another insulating layer and a second conductor is provided over and on this further insulating layer. Such a crossing has several disadvantages the most important of which is that the conductors cannot be formed on the insulating layer in one operation since they locally intersect at different levels, thus making the manufacture of the device complicated. In fact, in view of the small dimensions of composite semiconductor devices, it is very difficult correctly to position the conductors in two or more sequential steps, which steps are furthermore time-consuming. Besides, the provision of a further insulating layer requires a troublesome additional process.

The invention is based inter alia on recognition of the fact that for reasons of technical manufacture it is very desirable that, when using intersecting connections, the conductors can still be formed on the insulating layer in one operation, while the provision of another insulating layer on a conductor is avoided.

The invention is also based on the recognition that one of the intersecting conductive connections may include, at a crossing, a diffused surface zone which is located under the insulating layer and provided in the carrier body, said zone in the carrier body being surrounded by a second zone of a conductivity type opposite to that of the surface zone and the underlying portion of the carrier body, resulting in a p-n junction between the surface zone and the second zone, and one between the second zone and the underlying portion of the carrier body. During operation, one of these p-n junctions is always biased in the reversed direction independently of the polarity of the potential of the relevant conductive connection with respect to the carrier body, so that short-circuit between the relevant conductive connection and the carrier body is avoided. The diffused zones required for a plurality of crossings may be formed in a simple manner in one operation since it is not necessary to take into account the polarity of the potential of the relevant intersecting conductive connections with respect to the carrier body. A composite semiconductor device according to the invention of the kind mentioned in the preamble is thus characterized in that at least one crossing of conductive connections is present one connection of which comprises, at the crossing, a conductor formed on the insulated layer, while at the crossing the carrier body has a diffused surface zone which is located beneath the insulating layer and surrounded in the semiconductor body by a second diffused zone of a conductivity type opposite to that of the surface zone and that of the underlying portion of the carrier body, the other crossing connection comprising the surface zone and conductors formed on the insulating layer and adjoining the said surface zone.

If, during the operation of a composite semiconductor device according to the invention, the p-n junction between the surface zone and the second zone at a crossing is permanently biased in the reverse direction it is preferable that the p-n junction between the second zone and the underlying portion of the carrier body is substantially short-circuited, whereas if the p-n junction between the second zone and the underlying portion of the carrier body is permanently biased in the reverse direction it is preferable that the p-n junction between the surface zone and the second zone is substantially short-circuited. Any leakage currents through the p-n junction biased in the blocking direction are thus limited. One preferred embodiment of a composite semiconductor device according to the invention is thus characterised in that at least one crossing of conductive connections is present in which the p-n junction between the second diffused zone and the underlying portion of the carrier body is substantially short-circuited, while another preferred embodiment according to the invention is characterised in that at least one crossing of conductive connections is present in which the p-n junction between the surface zone and the second diffused zone is substantially short-circuited.

Furthermore a very important preferred embodiment according to the invention is characterized in that at least one crossing of conductive connections is present in which the surface zone and second diffused zone present at crossing correspond in thickness or depth, conductivity type and conductivity to the adjacent zones of relatively opposite conductivity types of at least one circuit element. This means that the manufacture of the composite semiconductor device is very simple since the zones required as the crossing can be obtained simultaneously with corresponding zone of one or more circuit elements.

It is to be noted that the said similarity between zones of a circuit element and the zones associated with a crossing may be local for a zone of a circuit element because a further zone may be provided in a portion of the relevant zone of a circuit element, for example, by local diffusion of an impurity.

In electronics circuits are frequently used in the form of matrices of circuit elements which circuits have a network of intersecting conductors and in which at each crossing the intersecting conductors are connected to each other by a circuit element. The circuit elements are often bistable elements which in themselves may comprise a plurality of individual circuit elements. Such matrices are often used as storage elements in computers. The invention is especially important for such matrices of circuit elements in which a plurality of crossings of conductors are required in view of the network of conductors. The present invention therefore especially relates to a composite semiconductor device which, according to the invention, is characterized in that it comprises, at least in part, a matrix of circuit elements having a network of intersecting conductive connections on the side of the carrier body on which the insulating layer is present.

The invention also relates to a method of manufacturing composite semiconductor devices according to the invention. Such a method is characterized in that the diffused surface zone and diffused second zone to be provided at a crossing are formed simultaneously with and by the same treatment as two adjacent zones of relatively opposite conductivity types of at least one circuit element.

The following is to be noted. In numerous cases a complex semiconductor device of the present kind comprises at least one transistor structure in which the base zone and the emitter zone are diffused zones whereas the collector zone is formed by at least the adjacent portion of the carrier body. The emitter zone usually has very low resistance so that the surface zone associated with a crossing of conductive connections is preferably very similar to such an emitter zone. However, such an emitter zone has the same conductivity type as the (adjacent portion of the) carrier body so that, in order to avoid short-circuit between the surface zone and the carrier body, the second diffused zone is required which may be similar to the base zone of the transistor structure. A structure of the same kind as the transistor structure thus occurs at the crossing and the two structures may be formed simultaneously in a simple manner by the same treatment.

In order that the invention may be readily carried into effect, it will now be described in detail, by way of example, with reference to the accompanying diagrammatic drawings, in which:

FIGURE 1 shows a circuit diagram of a matrix of circuit elements 1, which matrix comprises a plurality of individual circuit elements of which FIGURE 2 shows the circuit diagram;

FIG. 3 shows schematically and in perspective a view of a composite semiconductor device according to the invention having a circuit diagram as shown in FIGURES 1 and 2;

It is to be noted that corresponding parts are indicated in the figures by the same reference numerals or characters.

Figures 1, 2, 3:
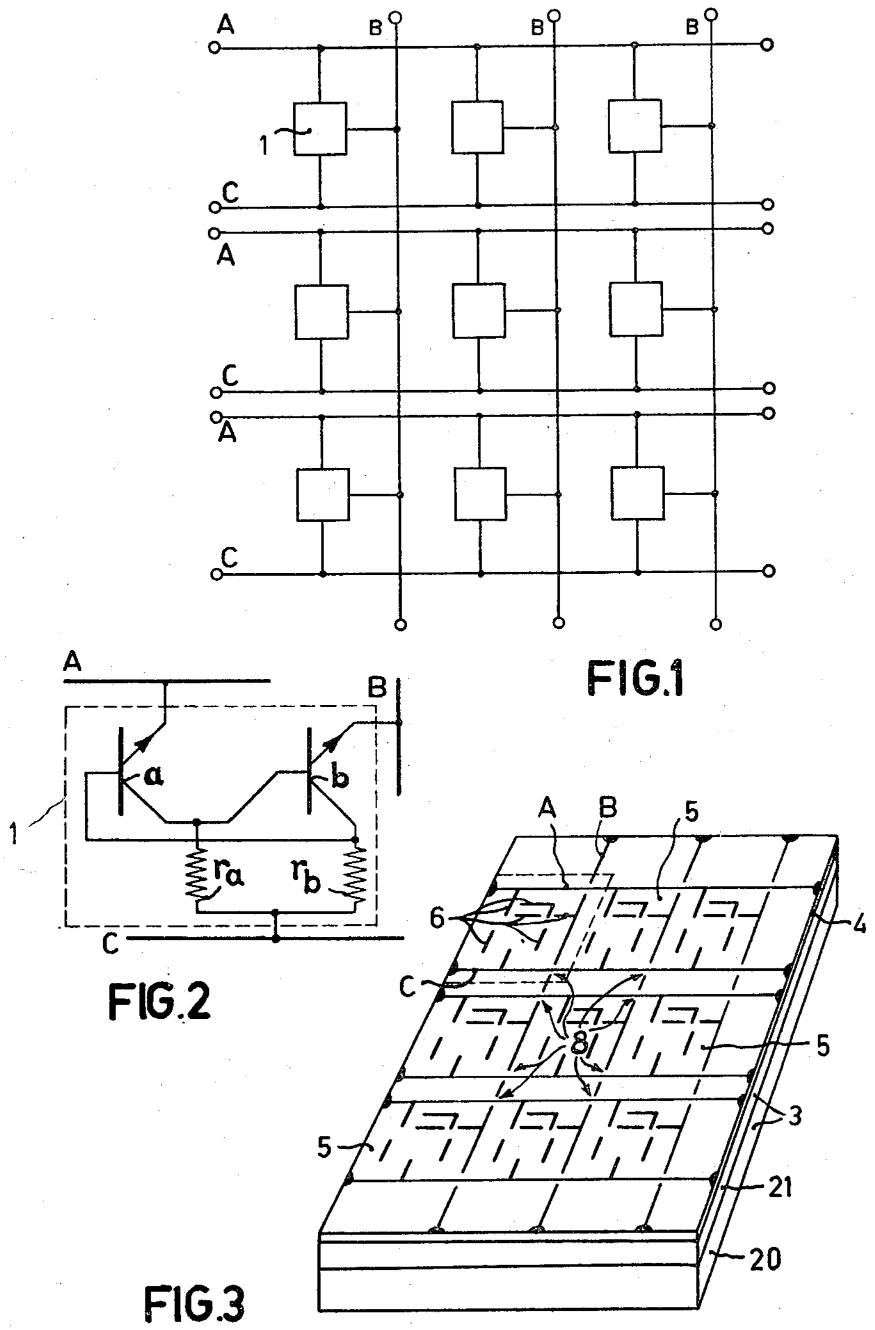

The embodiment to be described relates to a composite semiconductor device according to the invention which comprises a matrix of circuit elements with a network of intersecting conductive connections on the side of the carrier body on which the insulating layer is located. The circuit diagram of the matrix of circuit elements is shown in FIGURE 1. The circuit elements 1 in the present example are bistable elements, that is to say that they have two stable conditions and may be controlled from one stable condition to the other (or conversely) by means of voltages set up at conductors A and B. The conductors A and B form a network of intersecting conductive connections. Such circuits are generally known per se and are used, for example, in computers.

The bistable elements 1 employed in the embodiment to be described are so-called flip-flop circuits the circuit diagram of which is shown in FIGURE 2. Such flip-flop circuits are in themselves also generally known. Conductors C serve only to apply a constant bias, control being effected by means of voltages set up at the conductors A and B. Each bistable element 1 thus comprises in itself that portion of the circuit of FIGURE 2 which is shown in broken line.

The circuit shown in FIGURE 2 comprises two n-p-n type transistors $a$ and $b$ and two resistors $r_a$ and $r_b$ each of about 100,000 ohms. During operation, the conductor C is connected, for example, to ground and a negative voltage of, for example, −2.5 volts is applied to the conductors A and B. The transistor $a$ is then, for example, in the so-called off-condition and the transistor $b$ in the so-called on-condition. The transistor $a$ assumes the so-called on-condition and the transistor $b$ the so-called off-condition by temporarily applying a lower voltage, for example, −3 volts to the conductor A and a higher voltage, for example, −2 volts to the conductor B. The conditions of the transistors $a$ and $b$ are reversed if temporarily −2 volts are applied to the conductor A and −3 volts to the conductor B. So in the circuit of FIGURE 1 the conditions of the transistors $a$ and $b$ may be adjusted at will for each element 1.

The composite semiconductor device is shown diagrammatically and in perspective in FIGURE 3 and comprises a semiconductor carrier body 3, for example, of silicon which is covered on one side with an insulating layer 4, for example, of silicon oxide. Circuit elements are present on the side of the insulating layer 4 and beneath this layer, namely two n-p-n type transistors and two resistors for each rectangle 5, while conductors A, B, C and 6 are provided on the insulating layer 4 for forming conductive connections.

Figures 4, 5:
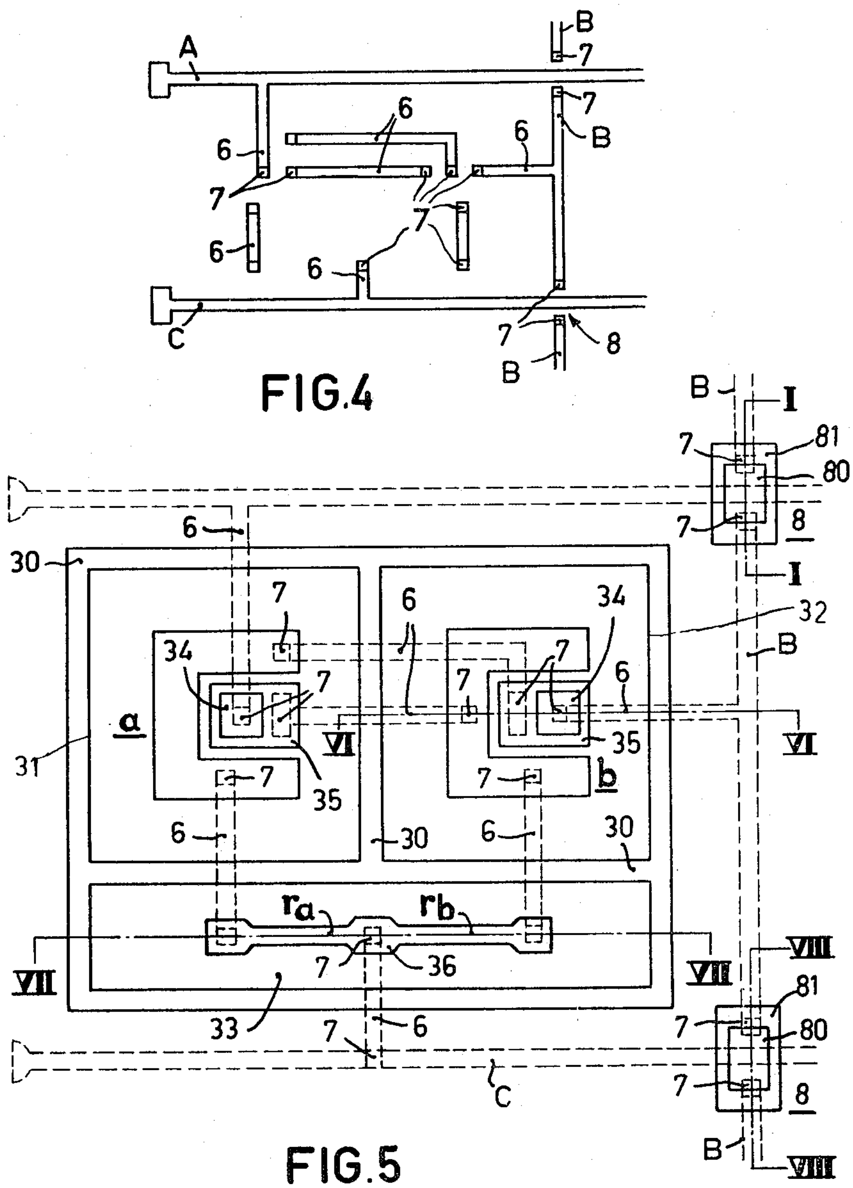
FIGURE 4 shows schematically a plan view on an enlarged scale of the portion of the composite semiconductor device of FIGURE 3 outlined by the broken line.
FIGURE 5 shows a plan view of the same portion as FIG. 4, but after removal of the insulating layer located on top of it.

The pattern of the conductors, shown in broken line in FIGURE 3, is illustrated on an enlarged scale in FIGURE 4. The insulating layer 4 has apertures 7 through which the conductors may make contact with zones of the circuit elements located beneath the oxide layer 4.

The conductors 6 and also the conductors A, B and C comprise conductive aluminum strips obtained by evaporation-deposition, which strips are, for example, approximately 24 microns wide and, for example, approximately 0.2 micron thick.

From FIGURES 1 and 3 it can readily be seen that the conductors B must intersect the conductors A and C.

Figure 8:
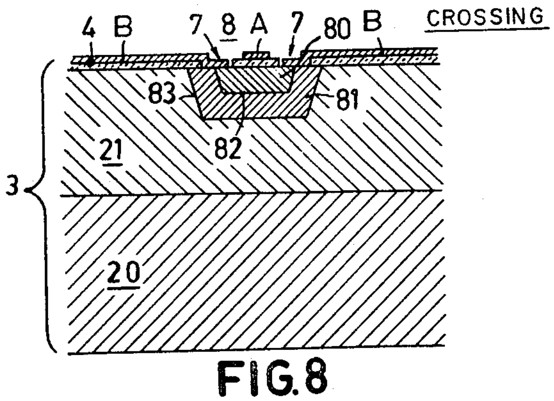

According to the invention there are crossings 8 of conductive connections one connection of which comprises, at a crossing 8, a conductor A or C which is formed on the insulating layer 4, while the carrier body 3 at a crossing 8 has a diffused surface zone 80 located beneath the insulating layer 4 (see FIGURE 5 which is a plan view of the diffused zones located in each square 5 under the oxide layer and forming the circuit elements and the intersecting connections and FIGURE 8 which is a cross-sectional view of a crossing 8 taken on the line VIII—VIII of FIGURE 5), which diffused surface zone 80 in the carrier body 3 is surrounded by a second diffused zone 81 of a conductivity type opposite to that of the surface zone 80 and the underlying portion 21 of the carrier body 3, the other crossing connection comprising the surface zone 80 and conductors B, formed on the insulating layer 4 and adjoining the said surface zone. The conductors B make contact with the zone 80 through apertures 7 in the insulating layer 4.

In the present example, the carrier body 3 comprises a p-type silicon plate 20 having a specific resistance of about 3 ohm-cm., provided with an n-type epitaxial silicon layer 21 having a specific resistance of about 0.5 ohm-cm. The zone 80 is thus of n-type conductivity and the zone 81 of p-type conductivity.

During the operation of the composite semiconductor device, one of the dished p-n junctions 82 and 83, located respectively at the boundary surface between the surface zone 80 (see FIGURE 8) and the second zone 81 and at the boundary surface between the second zone 81 and the underlying portion 21 of the carrier body 3, is permanently biased in the reverse direction independently of the polarity of the potential of the relevant conductive connection (the conductors B with their zone 80) with respect to the carrier body 3 (especially the underlying portion 21). Short-circuit between the zone 80 and the underlying portion 21 is thus prevented.

As previously mentioned, during operation, a negative voltage is applied to the conductors B, whereas the conductors C (see especially FIGURE 4) and thus the underlying portion 21 are connected to ground, as will be explained further hereinafter. This implies that the p-n junction 83 is biased in the reverse direction.

The p-n junction 82 present between the surface zone 80 and the second diffused zone 81 is preferably substantially short-circuited so that any leakage currents flowing between the zone 80 and the underlying portion 21 are limited at least to a great extent.

If the conductor B were connected to a positive potential with respect to the underlying portion 21, then the p-n junction 83 present between the second zone 81 and the underlying portion 21 is preferably substantially short-circuited.

In the present example, the apertures 7 (see FIGURE 8) in the insulating layer 4 overlap the p-n junction 82. The conductors B make contact through the apertures 7 not only with the surface zone 80 but also with the second zone 81 so that the p-n junction 82 is substantially short-circuited.

It is to be noted that in many cases it is preferable that the p-n junction to be short-circuited is short-circuited over a great portion of the length of its intersecting line with the surface of the carrier body 3.

If, for example, the insulating layer 4 is removed from the zone shown in broken line in FIGURE 3, the underlying diffused zones which form the circuit elements become visible as shown in FIGURE 5. (The picture of the circuit elements after removal of the insulating layer 4 is naturally the same for each rectangle 5.) The conductors 6 and A, B and C located on the removed portion of the insulating layer (see FIGURE 4) are shown in broken line in FIGURE 5 as well as the aperture 7 provided in the insulating layer 4 and through which the said conductors make contact with the zones located beneath the insulating layer. The said zones form, together with the said conductors, a circuit the diagram of which is shown in FIGURE 2.

As previously mentioned, the carrier body 3 comprises (see FIGURES 3 and 5 to 8) a p-type silicon plate 20, covered with an epitaxial n-type layer 21. The carrier body 3 and the n-type layer 21 are, for example, 200 microns and 12 microns thick respectively. The insulating layer 4 of silicon oxide is applied to the epitaxial n-type layer in a manner usual in the semiconductor type technique.

P-type zones 30, which are, for example, approximately 30 microns wide, are formed by diffusion of an impurity, resulting in n-type "islands" 31, 32 and 33, which are entirely surrounded by p-type material and comprise portions of the n-type layer 21. The circuit elements, which are relatively shielded by the p-type zones 30, are provided in the said "islands." The "islands" 31 and 32 have, for example, dimensions of $300\mu$ x $300\mu$ and the "island" 33 has dimensions of $130\mu$ x $630\mu$.

The p-type zones 30 may be obtained as follows: At areas at which the zones 30 are desired, the insulating layer 14 is removed in a manner usual in the semiconductor technique by means of a photosetting lacquer, sometimes referred to as "photoresist," and an etchant. Next, the carrier body 3 is heated to 950° C. for example, in a quartz tube which also contains a certain amount of boron oxide which is heated to a temperature of 1100° C. A dry atmosphere of argon is maintained in the tube. After 30 minutes the amount of boron oxide is removed and the carrier body heated at 1130° C. for about 48 hours while leading over nitrogen which has been saturated with water vapour at approximately 20° C. The p-type zones 30 are thus obtained by diffusion of boron, while the silicon-oxide layer 4 is grown again at the zones 30. The surface concentration of the zones 30 is approximately $10^{10}$ boron atoms/cm.$^3$.

Subsequently the transistor structures *a* and *b* (see also FIGURE 2) and the resistors $r_a$ and $r_b$ may be formed in the "islands" 31, 32 and 33.

Figure 6:
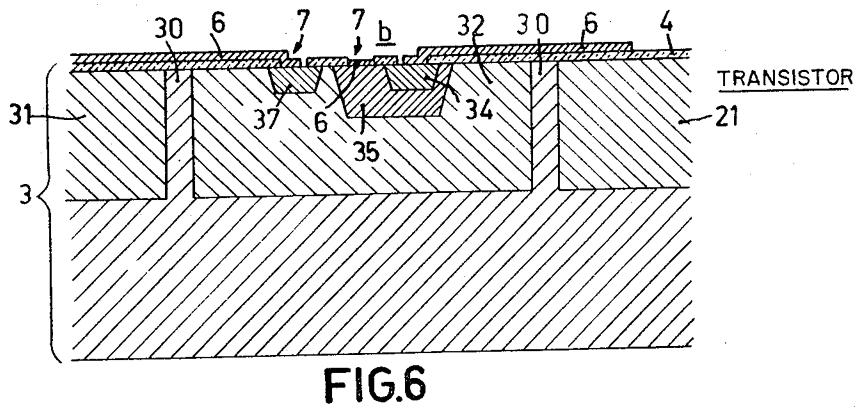
FIGURES 6, 7 and 8 are cross-sectional views, taken on the lines VI—VI, VII—VII and VIII—VIII, respectively, of FIGURE 5.
Figure 7:
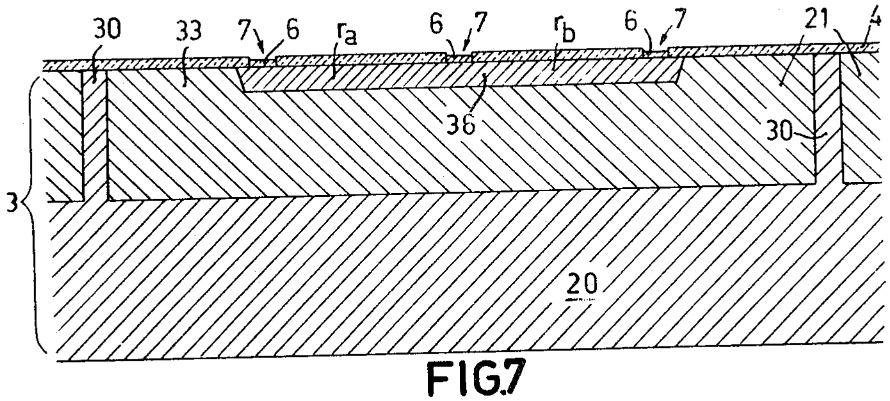

The transistor structures *a* and *b* comprise an n-type emitter zone 34, a p-type base zone 35, and an n-type collector zone formed by the n-type "islands" 31 and 32 respectively. To obtain good contact with the collector zones, n-type diffused zones 37 are formed having a specific resistance lower than that of the n-type "islands" 31 and 32. The transistor structures *a* and *b* are of the same kind so that a cross-section of transistor structure *b* only is shown in FIGURE 6.

The surface zone 80 and the second diffused zone 81 present at each crossing 8 are preferably similar to thickness, conductivity type and conductivity to two adjacent zones of relatively opposite conductivity types, namely the emitter zone 34 and the base zone 35 of the circuit elements formed by the transistors *a* and *b*. This affords the advantage that the zones 34 and 35 may be obtained simultaneously with the zones 80 and 81 and hence the surface zone 80 and the second zone 81 present at a crossing 8 are preferably formed simultaneously with and by the same treatment as the adjacent emitter zone 34 and base zone 35.

A diffused p-type zone 36, which constitutes the resistors $r_a$ and $r_b$, may be obtained simultaneously with the p-type base zones 35. The diffused n-type zones 37, which serve to make good ohmic contact with the n-type collector zones formed by the n-type "islands" 31 and 32, may be obtained simultaneously with the n-type emitter zones 34.

The zones 35, 36 and 81 may be formed as follows:

In a manner usual in the semiconductor technique, the silicon-oxide layer 4 is first removed by means of a photoresist and an etchant at areas where the zones 35, 36 and 81 are desired.

Next the carrier body 3 is maintained at a temperature of 900° C. for about 10 minutes, for example, in a quartz tube in which a dry atmosphere of argon is maintained and which also contains a certain amount of boron oxide which is maintained at about 1050° C. Thereafter the amount of boron oxide is removed and the carrier body 3 afterheated at a temperature of approximately 1150° C. for approximately 60 minutes while leading over dry nitrogen during the first 30 minutes and nitrogen to which water vapor has been added to regrow the silicon-oxide layer 4 during the second 30 minutes. The p-type zones 35, 36 and 81 are obtained by diffusion of boron and have a surface concentration of approximately $10^{18}$ boron atoms/cm.$^3$ and are approximately 3 microns thick.

Now the n-type zones 34, 37 and 80 may be formed. As before, the silicon-oxide layer 4 is first removed at the relevant areas in the described manner. Next the carrier body 3 which is, for example, again housed in a quartz tube is maintained at a temperature of approximately 1025° C. for about 10 minutes while leading over dry nitrogen which is also being led over an amount of phosphorous pentoxide maintained at a temperature of approximately 220° C. Thereafter the carrier body is afterheated at approximately 1120° C. for approximately 3 minutes while leading over water vapor to grow the oxide layer 4. The zones 34, 37 and 80 are obtained by diffusion of phosphorus atoms and have a surface concentration of approximately $10^{21}$ phosphorus atoms/cm.$^3$, and are approximately 2 microns thick.

In a manner usual in the semiconductor technique, the apertures 7 in the oxide layer 4 may now be formed by means of a photoresist and an etchant and also the conductors 6, A, B and C may be obtained by evaporation-deposition of aluminum and local etching away of the resulting aluminum layer by means of a photoresist and an etchant.

It is to be noted that at the area at which the conductor C is connected to a conductor 6 (see FIGURE 5) an aperture 7 exists in the oxide layer 4 through which the conductor C is connected to the underlying portion of the carrier body 3 and this underlying portion during operation acquires the same potential as the conductor C (which is connected, for example, to ground).

It is also to be noted that the zones 80, 81, 34, 35 and 36 may have surface areas of approximately 50 x 125$\mu$, 75 and 125$\mu$, 50 x 50$\mu$, 75 x 110$\mu$ and 30 x 425$\mu$, respectively, while the largest dimensions of the zones 37 are approximately 175$\mu$ x 200$\mu$.

The example described relates to a matrix having nine circuit elements 1 (see FIGURE 1). However, the number of circuit elements 1 may be very much larger, as will also usually be the case in practice.

It will be evident that the invention is not limited to the example described and that many variations are possible to a man skilled in the art without passing beyond the scope of the invention. Thus the bistable elements 1 (see FIGURE 1) which comprise a circuit the diagram of which is shown in FIGURE 2, can be replaced by numerous other, for example, bistable elements such as, for example, controlled p-n-p-n type (or n-p-n-p type) rectifiers. Also in electronics numerous other circuits than a matrix of circuit elements are conceivable in which crossing of conductive connections are necessary or applicable with advantage. The conductors can be made, for example, of silver instead of aluminum and the carrier body may be made of a semiconductor material other than silicon, for example, of an $A_{III}B_V$ compound.

What is claimed is:

1. A solid semiconductor circuit comprising a body of semiconductive material containing a plurality of circuit elements including at least one active transistor element extending from one major surface of the body and comprising adjacent dish-shaped emitter and base diffused regions of opposite conductivity type forming two p-n junctions, said emitter region having a resistivity lower than that of said base region, a layer of insulating material on said major surface of the body and protecting the underlying circuit elements, a plurality of conductors provided on the insulating layer and providing connections to and between the circuit elements through apertures in the insulating layer, at least two of said conductors crossing one another, one of said conductors constituting a continuous conductor on the insulating layer, the other of said conductors being interrupted at said one conductor and being divided into two spaced conductive portions on the insulating layer, and means for conductively connecting together said two spaced conductive portions, said means including a first diffused surface zone extending from said major surface in the semiconductive body under the insulating layer at the crossing and of the same type conductivity as that of the main underlying body portions and having the same type of conductivity, conductivity magnitude, and depth as that of the transistor emitter diffused region and having been made simultaneously with the latter, said means further including a second diffused zone surrounding the first diffused zone and of the opposite conductivity type and having the same type of conductivity, conductivity magnitude, and depth as that of the transistor base diffused region and having been made simultaneously with the latter and forming a first p-n dish-shaped junction with the first diffused zone and a second p-n dish-shaped junction with the main underlying body portions, means for short-circuiting one of said first and second p-n junctions formed by the second diffused zone, and means connecting the adjacent ends of the two spaced conductive portions through the insulating layer to the first diffused zone.

2. A circuit as set forth in claim 1 wherein the insulating layer is of silicon oxide, and the conductors are of aluminum and are deposited by evaporation.

3. A circuit as set forth in claim 1 and comprising a matrix of circuit elements interconnected by a network of crossed insulated conductors, and wherein the circuit elements form plural bistable circuits for selectively interconnecting the conductors.

References Cited by the Examiner

UNITED STATES PATENTS

| | | | |
|---|---|---|---|
| 2,981,877 | 4/1961 | Noyce | 317—235 |
| 3,029,366 | 4/1962 | Lehovec | 317—235 X |
| 3,100,276 | 8/1963 | Meyer | 317—234 |
| 3,150,299 | 11/1964 | Noyce | 317—235 |
| 3,199,002 | 8/1965 | Martin | 317—234 |
| 3,210,620 | 10/1965 | Lin | 317—234 |
| 3,210,677 | 10/1965 | Lin et al. | 317—235 X |

JOHN W. HUCKERT, *Primary Examiner.*

A. M. LESNIAK, *Assistant Examiner.*